(12) United States Patent
Huang et al.

(10) Patent No.: US 11,222,857 B2
(45) Date of Patent: Jan. 11, 2022

(54) METHOD OF FORMING A PHOTORESIST OVER A BOND PAD TO MITIGATE BOND PAD CORROSION

(71) Applicant: Taiwan Semiconductor Manufacturing Co., Ltd., Hsin-Chu (TW)

(72) Inventors: Chih-Fan Huang, Kaohsiung (TW); Dian-Hau Chen, Hsinchu (TW); Mao-Nan Wang, Kaohsiung (TW); Tzu-Li Lee, Yunlin (TW); Yen-Ming Chen, Chu-Pei (TW); Tzung-Luen Li, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/798,749

(22) Filed: Feb. 24, 2020

(65) Prior Publication Data

US 2021/0265291 A1     Aug. 26, 2021

(51) Int. Cl.
*H01L 23/498* (2006.01)
*H01L 23/00* (2006.01)

(52) U.S. Cl.
CPC ........ *H01L 24/03* (2013.01); *H01L 23/49811* (2013.01); *H01L 24/05* (2013.01); *H01L 24/11* (2013.01); *H01L 24/13* (2013.01); *H01L 2224/0381* (2013.01); *H01L 2224/03416* (2013.01); *H01L 2224/03515* (2013.01)

(58) Field of Classification Search
CPC ..................................................... H01L 24/03
See application file for complete search history.

(56) References Cited

U.S. PATENT DOCUMENTS

2013/0180945 A1* 7/2013 Koitz ............... H01L 21/02063
                                                                216/13
2018/0090460 A1* 3/2018 Chu ..................... H01L 23/562

OTHER PUBLICATIONS

Massey University. "The Sign of the Second Derivative" Published on Nov. 21, 2012.
Wikipedia.org "Imide" Published on Jan. 22, 2020.
Wikipedia.org "Plasma Ashing" Published on May 12, 2016.
Wikipedia.org "Semiconductor Package" Published on Nov. 27, 2019.

* cited by examiner

*Primary Examiner* — William A Harriston
(74) *Attorney, Agent, or Firm* — Eschweiler & Potashnik, LLC

(57) ABSTRACT

In some embodiments, the present disclosure relates to a method including forming an interconnect structure over a substrate. A bond pad may be coupled to the interconnect structure, and a polymeric material may be deposited over the bond pad. In some embodiments, the method further includes performing a patterning process to remove a portion of the polymeric material to form an opening in the polymeric material. The opening directly overlies and exposes the bond pad. Further, the method includes a first cleaning process. The polymeric material is cured to form a polymeric protection layer, and a second cleaning process is performed.

20 Claims, 10 Drawing Sheets

METHOD OF FORMING A PHOTORESIST OVER A BOND PAD TO MITIGATE BOND PAD CORROSION

BACKGROUND

The semiconductor industry continues to improve the integration density of various electronic components (e.g., transistors, diodes, resistors, capacitors, etc.) by, for example, reducing minimum feature sizes, which allows more components to be integrated into a given area. Smaller package structures, that utilize less area or smaller heights, are developed to package the semiconductor devices. New materials and corresponding methods are being researched to achieve minimum features sizes in electronic components and package structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
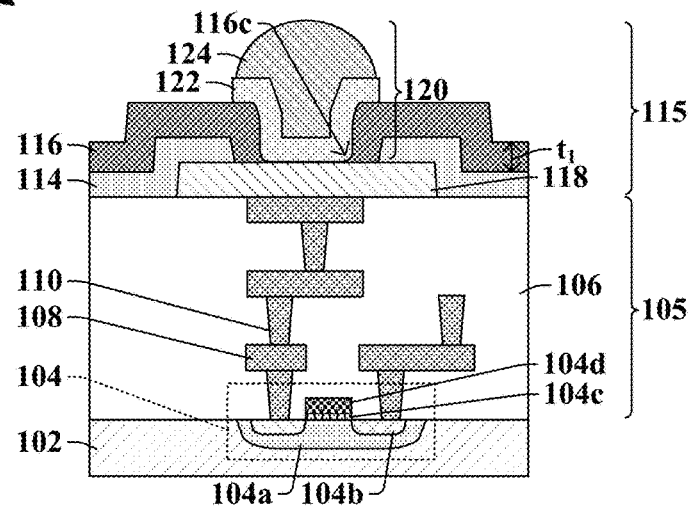
FIG. 1A illustrates a cross-sectional view of some embodiments of an integrated chip having a polymeric protection layer arranged over an interconnect structure, wherein the polymeric protection layer has a substantially curved inner corner region.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip may comprise a package structure, which includes a bond pad coupled to an underlying interconnect structure and a bonding structure (e.g., an under bump metallurgy) disposed over and coupled to the bond pad. To contact the bond pad, the bonding structure extends through a polymeric protection layer that is configured to protect the integrated chip from thermal and mechanical stresses during external bonding processes (e.g., bonding the integrated chip to a printed circuit board, bonding the integrated chip to another integrated chip, etc.). A polymeric protection layer may be formed by depositing a polymeric material over the bond pad, patterning the polymeric material to form an opening over the bond pad, and curing the polymeric material. After the curing of the polymeric material the bond pad is cleaned through an ashing process, and then the integrated chip is cleaned by a scrub process.

As the size of integrated chips has decreased, the demands on polymeric protection layers has also increased. For example, as the size of integrated chips decreases, polymeric protection layers having a lower curing temperature, a smaller opening over a bond pad, a smaller coefficient of thermal expansion (e.g., CTE), etc., are desired. It has been appreciated that using a polymeric protection layer comprising a halogen (e.g., fluorine, chlorine, etc.) can allow for the polymeric protection layer to be thicker and thus, more protective, without sacrificing the size of the opening in the polymeric protection layer when compared to other polymeric protection layers that do not comprise a halogen. Further, the polymeric protection layer that comprises a halogen may have a lower curing temperature, a lower coefficient of thermal expansion and thus, improved thermal properties when compared to other polymeric protection layers that do not comprise a halogen.

However, during an ashing process used to clean a bond pad, bonds between the halogens and the polymer backbone (e.g., carbon structure) may break such that "loose" halogen ions are present on the bond pad. The "loose" halogen ions may react with cleaning solutions, such as water, used in a scrub process and form an acid that is corrosive to the bond pad. Over time, corrosion to the bond pad may progress, and the bond pad may fail to provide an electrical connection between the interconnect structure and the bonding structure. Thus, the halogens present in the polymeric protection layer put the integrated chip at risk of malfunctioning.

Various embodiments of the present disclosure present a method of forming a polymeric protection layer comprising halogens, which prevents or mitigates corrosion of the bond pad. In such embodiments, instead of performing the ashing process after the curing of the polymeric material, the ashing process is performed before the curing of the polymeric material. As a result, "loose" halogen ions formed during the ashing process may be re-bonded back into the polymeric material during the curing and prior to performing of the scrub process. In some embodiments, for example, at least 50 percent of the "loose" halogen ions are re-bonded during the curing of the polymeric material. Then, after the curing of the polymeric material, the scrub process is performed with a reduced concentration of halogen ions present, thereby mitigating corrosion to the bond pad and increasing longevity of the bond pad.

FIG. 1A illustrates a cross-sectional view 100A of some embodiments of an integrated chip comprising a polymeric protection layer.

The integrated chip in the cross-sectional view 100A includes a semiconductor device 104 arranged over a substrate 102. In some embodiments, the semiconductor device 104 may be a transistor, whereas in other embodiments, the semiconductor device 104 may be a diode, resistor, capacitor, or the like. For example, in the cross-sectional view 100A, the semiconductor device 104 is or comprises a metal oxide semiconductor field effect transistor (MOSFET). In such embodiments, the semiconductor device 104 may comprise a well region 104a within the substrate 102, wherein the well region 104a may have a first doping type. Source/drain regions 104b may be arranged in the substrate 102 and have a second doping type opposite to the first doping type. A gate electrode 104d may be arranged over the substrate 102 and between the source/drain regions 104b. In some embodiments, a gate dielectric layer 104c separates the gate electrode 104d from the substrate 102.

In some embodiments, an interconnect structure 105 is arranged over the substrate 102. The interconnect structure 105 comprises, in some embodiments, interconnect wires 108 and interconnect vias 110 embedded in an interconnect dielectric structure 106. In some embodiments, the interconnect wires 108 and the interconnect vias 110 are coupled to the semiconductor device 104. For example, in the cross-sectional view 100A of FIG. 1A, the interconnect structure 105 is at least coupled to the source/drain regions 104b of the semiconductor device 104.

In some embodiments, a package structure 115 is arranged over the interconnect structure 105. The package structure 115 may comprise a bond pad 118 that is coupled to the interconnect wires 108 and interconnect vias 110. The bond pad 118 may comprise a conductive metal such as, for example, aluminum, copper, tungsten, or the like. In some embodiments, the bond pad 118 is arranged above the interconnect dielectric structure 106. In other embodiments, portions of the interconnect dielectric structure 106 at least partially surround outer sidewalls of the bond pad 118. In some embodiments, a passivation layer 114 is arranged over the bond pad 118 and over the interconnect structure 105. The passivation layer 114 may comprise a dielectric material such as, for example, silicon nitride, silicon oxide, or the like.

In some embodiments, the package structure 115 may further comprise a polymeric protection layer 116 arranged over the passivation layer 114 and over the bond pad 118. The polymeric protection layer 116 may extend through the passivation layer 114 to directly contact the bond pad 118. In some embodiments, the polymeric protection layer 116 has a first thickness $t_1$ in a range of between approximately 3 micrometers and approximately 10 micrometers. The first thickness $t_1$ may be a minimum thickness of the polymeric protection layer 116 that is measured from a top surface of the polymeric protection layer 116 to a top surface of the passivation layer 114, in some embodiments. The polymeric protection layer 116 is a photoresist material and may comprise a polymer structure that comprises carbon, oxygen, and a halogen. For example, in some embodiments, the polymeric protection layer 116 may comprise $C_aX_b$, wherein C is carbon, X is a halogen (e.g., chlorine, fluorine, etc.), and a and b are each any integer. For example, in some embodiments, a is equal to 1, and b is equal to 3. The $C_aX_b$ group may be bonded to, either directly or indirectly, other components of the polymer structure of the polymeric protection layer 116 such as, for example, carbon, a benzene ring, or oxygen, for example. Further, in some embodiments, the polymeric protection layer 116 may be or comprise a polyimide, and thus, also comprise an imide functional group which includes nitrogen and oxygen. It will be appreciated that other functional groups and/or elements are also within the scope of the disclosure.

Because the polymeric protection layer 116 comprises a halogen, in some embodiments, the polymeric protection layer 116 can be thicker and thus, more protective, without sacrificing the size of the opening in the polymeric protection layer 116 when compared to other types of polymeric protection layers that do not comprise a halogen. Further, because the polymeric protection layer 116 comprises a halogen may have a lower curing temperature, a lower coefficient of thermal expansion and thus, improved thermal properties when compared to other types of polymeric protection layers that do not comprise a halogen. Therefore, thermal degradation to the integrated chip comprising the polymeric protection layer 116 that includes a halogen may be mitigated and thus, reliability of the integrated chip may be increased.

For example, in some embodiments, the polymeric protection layer 116 may have a coefficient of thermal expansion that is less than or equal to about 30 parts per million per Kelvin per degree Celsius. For example, in some embodiments, the coefficient of thermal expansion of the polymeric protection layer 116 may be in a range of between approximately 5 parts per million per Kelvin per degree Celsius and approximately 20 parts per million per Kelvin per degree Celsius. A lower coefficient of thermal expansion reduces the expansion and compression by the polymeric protection layer 116 when exposed to temperature changes. Thus, less mechanical stresses are imposed on the integrated chip during temperature changes because the polymeric protection layer 116 has a lower coefficient of thermal expansion (e.g., less than or equal to 30 parts per million per Kelvin per degree Celsius). Further, in some embodiments, the polymeric protection layer 116 has a curing temperature that is less than or equal to about 300 degrees Celsius. For example, in some embodiments, the curing temperature of the polymeric protection layer 116 may be in a range of between approximately 50 degrees Celsius and approximately 300 degrees Celsius. In some other embodiments, the curing temperature of the polymeric protection layer 116 may be in a range of between approximately 275 degrees Celsius and approximately 285 degrees Celsius, for example. With a lower curing temperature (e.g., less than or equal to 300 degrees Celsius), the less likely features of the integrated chip are at risk of thermal degradation during the formation of the polymeric protection layer 116. Therefore, for at least these reasons, the polymeric protection layer 116 mitigates thermal and mechanical stresses on the package structure 115 and underlying features of the integrated chip during the formation of the package structure 115 and/or during external bonding processes (e.g., the bonding structure 120 is coupled to another integrated chip and/or a printed circuit board).

In some embodiments, a bonding structure 120 may extend through the polymeric protection layer 116 and the passivation layer 114 to directly contact the bond pad 118. In some embodiments, the bonding structure 120 may comprise, for example, an under bump metallization (UBM) layer 122 and a conductive bump 124 arranged over the UBM layer 122. In some embodiments, the external bonding process involves reheating the conductive bump 124 to bond the conductive bump 124 to some other electronic circuit (e.g., printed circuit board, another integrated chip). Thus, the polymeric protection layer 116 may protect the underlying integrated chip from damage by mechanical and thermal stresses associated with the external bonding process.

Further, in some embodiments, the polymeric protection layer 116 has an inner corner region 116c from the cross-sectional view 100A that directly contacts the UBM layer 122 and that is substantially rounded.

Figure 1B:
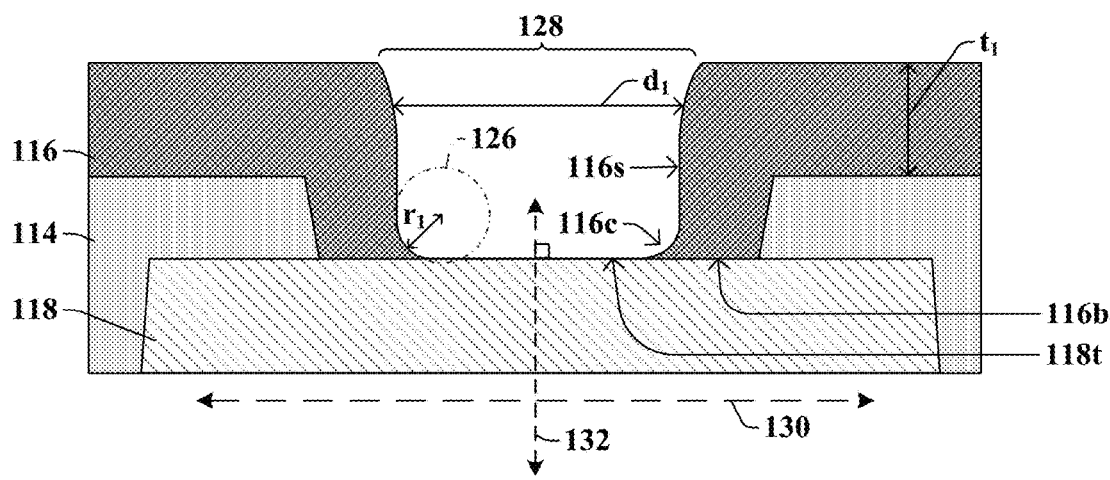
FIG. 1B illustrates a magnified cross-sectional view of the polymeric protection layer of FIG. 1A having a small radius of curvature.

FIG. 1B illustrates a magnified cross-sectional view 100B of some embodiments of the polymeric protection layer 116, the passivation layer 114, and the bond pad 118 of FIG. 1A. Thus, the magnified cross-sectional view 100B of FIG. 1B does not include the bonding structure 120 or features (e.g., substrate 102 of FIG. 1A, interconnect structure 105 of FIG. 1A, etc.) underlying the passivation layer 114 for clarity.

As shown in the magnified cross-sectional view 100B of FIG. 1B, the polymeric protection layer 116 comprises a first opening 128 that directly overlies and exposes the bond pad 118. The bonding structure 120 of FIG. 1A may extend through the first opening 128 to contact the bond pad 118. In some embodiments, the polymeric passivation layer 116 has a bottommost surface 116b that directly contacts the bond pad 118, and an innermost sidewall 116s that is connected or coupled to the bottommost surface 116b by the inner corner region 116c. In some embodiments, the first opening 128 has a width equal to a first distance $d_1$. The width of the first opening 128 may be a maximum width of the first opening 128 and measured between inner sidewalls of the polymeric protection layer 116. In some embodiments, because of the composition of the polymeric protection layer 116 and formation thereof, the first distance $d_1$ may be in a range of between, for example, approximately 10 micrometers and approximately 40 micrometers.

For example, in some embodiments, because the polymeric protection layer 116 comprises a halogen, the first opening 128 may be formed to have as small of a first distance $d_1$ of about 10 micrometers while the first thickness $t_1$ of the polymeric protection layer 116 is about equal to about 10 micrometers. Thus, in some embodiments, a ratio of the first thickness $t_1$ of the polymeric protection layer 116 to the first distance $d_1$ of the first opening 128 may be equal to about 1. In some other embodiments, the ratio of the first thickness $t_1$ of the polymeric protection layer 116 to the first distance $d_1$ of the first opening 128 is greater than at least 0.5.

Further, in some embodiments, during the formation of the polymeric protection layer 116, the polymeric protection layer 116 is cured between an ashing process and a scrub process. Because the polymeric protection layer 116 comprises halogens, the halogens may de-bond or become "loose" from the polymeric structure of the polymeric protection layer 116 during the ashing process. The halogens could react with solutions (e.g., water) during future processing steps to form an acid that would corrode exposed metals, such as, for example, the bond pad 118. By curing the polymeric protection layer 116 after the ashing process, some of the "loose" halogens may be re-bonded back into the polymeric structure of the polymeric protection layer 116. Then, when the polymeric protection layer 116 is exposed to a high moisture environment during the scrub process, the amount of "loose" halogens available to react with the moisture (e.g., water) and form an acid is reduced, thereby reducing corrosion to the bond pad and increasing reliability and longevity to the overall integrated chip.

As a result of the composition and/or the aforementioned formation of the polymeric protection layer 116, in some embodiments, the inner corner region 116c, has a radius of curvature $r_1$ that is less than or equal to approximately 5 micrometers. In some embodiments, the radius of curvature $r_1$ may be measured by drawing a circle 126 that has a perimeter that substantially overlaps with the curvature of the inner corner region 116c. The radius of the circle 126 is equal to radius of curvature $r_1$. Further, in some embodiments, the inner corner region 116c is concave up from the magnified cross-sectional view 100B with respect to a set of axes comprising a first axis 130 and a second axis 132. The first axis 130 may be perpendicular to the second axis 132, and the second axis 132 may be normal to a top surface 118t of the bond pad 118.

Figure 2:
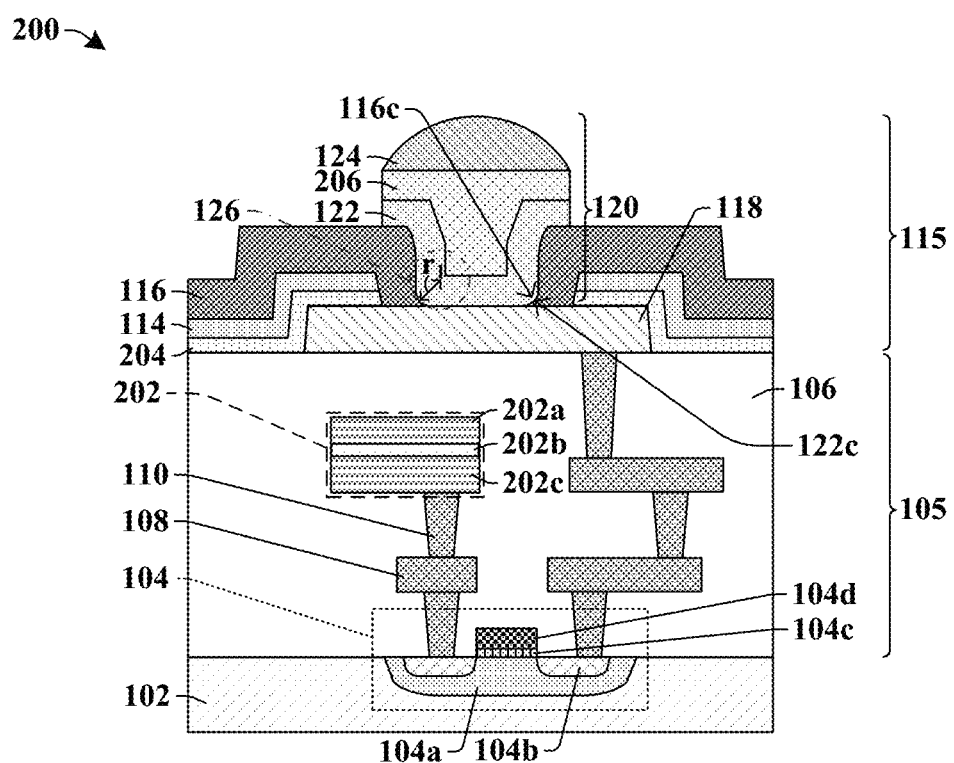
FIG. 2 illustrates a cross-sectional view of some other embodiments of an integrated chip having a polymeric protection layer arranged over a semiconductor device, wherein the polymeric protection layer has a substantially curved inner corner region.
Figure 3:
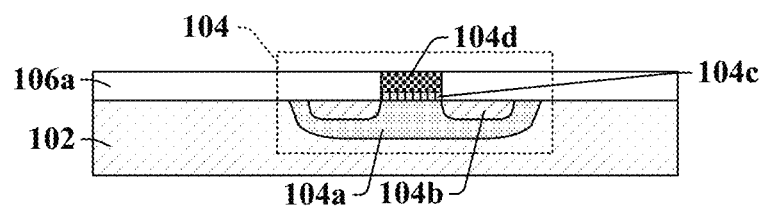
FIGS. 3-15 illustrate various views of some embodiments of a method of forming an integrated chip having a polymeric protection layer arranged over a bond pad, wherein damage to the bond pad is mitigated during formation of the polymeric protection layer.

FIG. 2 illustrates a cross-sectional view 200 of some other embodiments of an integrated chip comprising a polymeric protection layer.

In some embodiments, a memory device 202 is arranged within the interconnect structure 105 and coupled to the interconnect wires 108 and interconnect vias 110. For example, in some embodiments, the memory device 202 is coupled to the semiconductor device 104 through the interconnect structure 105. In some embodiments, the memory device 202 may comprise, for example, a metal-insulator-metal (MIM), phase change random access memory (PCRAM), magnetoresistive random-access memory (MRAM), or the like. The memory device 202 may also comprise various layers such as, for example, a top electrode layer 202a, a bottom electrode layer 202c, and a memory layer 202b (e.g., insulator layer, a phase change layer, etc.) arranged between the top and bottom electrode layers 202a, 202c.

Further, in some embodiments, an additional passivation layer 204 may be arranged between the passivation layer 114 and the interconnect dielectric structure 106. In such embodiments, the additional passivation layer 204 may also be arranged directly between the passivation layer 114 and the bond pad 118. In some embodiments, the additional passivation layer 204 may comprise, for example, a dielectric material such as a nitride (e.g., silicon nitride, silicon oxynitride), a carbide (e.g., silicon carbide), an oxide (e.g., silicon oxide), undoped silicate glass (USG), borosilicate glass (BSG), phosphoric silicate glass (PSG), borophosphosilicate glass (BPSG), a low-k oxide (e.g., a carbon doped oxide, SiCOH), or the like.

In some embodiments, the bonding structure 120 further comprises a conductive core structure 206 arranged between the UBM layer 122 and the conductive bump 124. In some embodiments, the conductive bump 124 comprises a solder material such as, for example, tin, silver, copper, bismuth, nickel, lead, or combinations thereof. In some embodiments, the conductive core structure 206 may comprise copper, aluminum, or the like. Further, in some embodiments, the UBM layer 122 may comprise copper, copper alloys, aluminum, aluminum alloys, or the like.

Further, in some embodiments, because the UBM layer 122 directly contacts the bond pad 118 and extends through the first opening (128 of FIG. 1B) of the polymeric protection layer 116, the UBM layer 122 may directly contact the inner corner region 116c of the polymeric protection layer 116. Thus, in some embodiments, the UBM layer 122 also has an inner corner region 122c that directly contacts the inner corner region 116c of the polymeric protection layer 116, and in such embodiments, the inner corner region 122c of the UBM layer 122 is also concave up with respect to the first and second axes (130, 132 of FIG. 1B). Further, in such embodiments, the inner corner region 122c of the UBM layer 122 may also have the radius of curvature $r_1$ that is less than or equal to approximately 5 micrometers.

FIGS. 3-15 illustrate various views 300-1500 of some embodiments of forming a polymeric protection layer over a bond pad. Although FIGS. 3-15 are described in relation to a method, it will be appreciated that the structures disclosed in FIGS. 3-15 are not limited to such a method, but instead may stand alone as structures independent of the method.

As shown in cross-sectional view 300 of FIG. 300, a substrate 102 is provided. In some embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

In some embodiments, a semiconductor device 104, such as a metal oxide semiconductor field effect transistor (MOSFET) is formed within and over the substrate 102. For example, in the cross-sectional view 300, a well region 104a may be formed within the substrate 102 using an ion implantation process to dope the substrate 102 to a first doping type having a first dopant concentration. Further, source/drain regions 104b may be formed using an ion implantation process to dope the substrate 102 to a second doping type having a second dopant concentration. In some embodiments, a gate dielectric layer 104c is formed over the substrate 102 and between the source/drain regions 104b, and a gate electrode 104d is formed over the gate dielectric layer 104c. The gate dielectric layer 104c comprises silicon dioxide in some embodiments, and the gate electrode 104d comprises a conductive material such as polysilicon or a conductive metal in some embodiments. The gate dielectric layer 104c and the gate electrode 104d may be formed through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching).

Further, in some embodiments, a first dielectric layer 106a may be formed over the substrate 102. In some embodiments, the first dielectric layer 106a is formed by way of a deposition process (e.g., CVD, PVD, ALD, etc.). In some embodiments, the first dielectric layer 106a comprises a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 4:
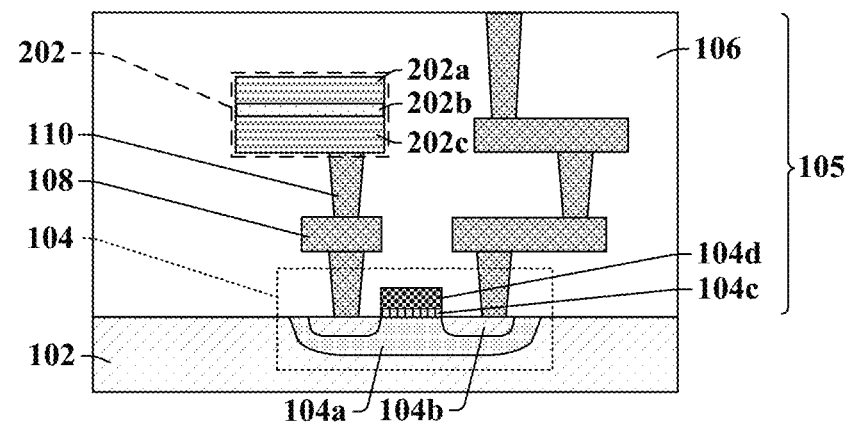

As shown in cross-sectional view 400 of FIG. 4, in some embodiments, an interconnect structure 105 is formed over the substrate 102. The interconnect structure 105 may comprise interconnect wires 108 and interconnect vias 110 embedded in an interconnect dielectric structure 106. In some embodiments, the interconnect dielectric structure 106 comprises a plurality of layers. Further, in some embodiments, the interconnect dielectric structure 106 of FIG. 4 includes the first dielectric layer 106a of FIG. 3. The interconnect dielectric structure 106 may comprise, for example, a nitride (e.g., silicon nitride, silicon oxynitride), a carbide (e.g., silicon carbide), an oxide (e.g., silicon oxide), undoped silicate glass (USG), borosilicate glass (BSG), phosphoric silicate glass (PSG), borophosphosilicate glass (BPSG), a low-k oxide (e.g., a carbon doped oxide, SiCOH), or a combination thereof. Further, the interconnect wires 108 and the interconnect vias 110 may comprise, for example, a conductive metal such as, for example, copper, aluminum, tungsten, or the like.

In some embodiments, a memory device 202 is also formed in the interconnect dielectric structure 106. The memory device 202 may be coupled to the semiconductor device 104 through the interconnect wires 108 and interconnect vias 110. In some embodiments, the memory device 202 may comprise, for example, a metal-insulator-metal (MIM), phase change random access memory (PCRAM), magnetoresistive random-access memory (MRAM), or the like. The memory device 202 may also comprise various layers such as, for example, a top electrode layer 202a, a bottom electrode layer 202c, and a memory layer 202b (e.g., insulator layer, a phase change layer, etc.) arranged between the top and bottom electrode layers 202a, 202c.

In some embodiments, the interconnect structure 105 and/or the memory device 202 may be formed through various steps comprising deposition processes (e.g., PVD, CVD, PE-CVD, ALD, sputtering, etc.), removal processes (e.g., wet etching, dry etching, CMP, etc.), and/or patterning processes (e.g., photolithography/etching). For example, in some embodiments, the interconnect wires 108 and the interconnect vias 110 may be formed through a damascene or a dual-damascene process.

Figure 5:
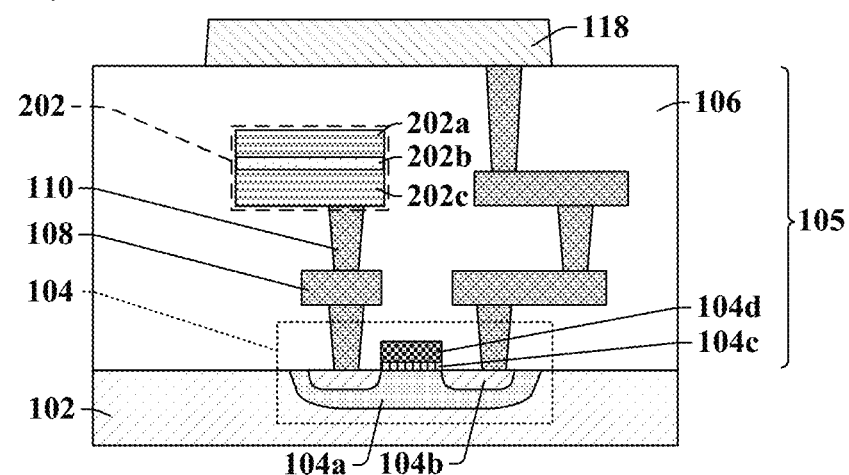

As shown in cross-sectional view 500 of FIG. 5, a bond pad 118 is formed over the interconnect structure 105. The bond pad 118 is coupled to one of the interconnect wires 108 or interconnect vias 110. In some embodiments, the bond pad 118 is also coupled to the memory device 202 and/or the semiconductor device 104 arranged over the substrate 102. In some embodiments, the bond pad 118 is formed by way of a deposition processes (e.g., PVD, CVD, PE-CVD, ALD, sputtering, etc.), a removal processes (e.g., wet etching, dry etching, CMP, etc.), and/or patterning processes (e.g., photolithography/etching). In some embodiments, the bond pad 118 comprises a conductive material, such as a conductive metal like aluminum, copper, aluminum copper, or the like.

For example, in some embodiments, a masking layer may be formed over the interconnect structure 105 and comprise an opening to expose one of the interconnect vias 110. A conductive material may be deposited over the masking layer and within the opening, and then a removal process may be performed to remove the conductive material over the masking layer. The masking layer may then be removed, thereby forming the bond pad 118. In other embodiments, for example, the conductive material may be deposited over the interconnect structure 105, and then peripheral portions may be selectively removed by way of patterning (e.g., photolithography/etching) and removal processes (e.g., wet etching, dry etching, CMP).

Figure 6:
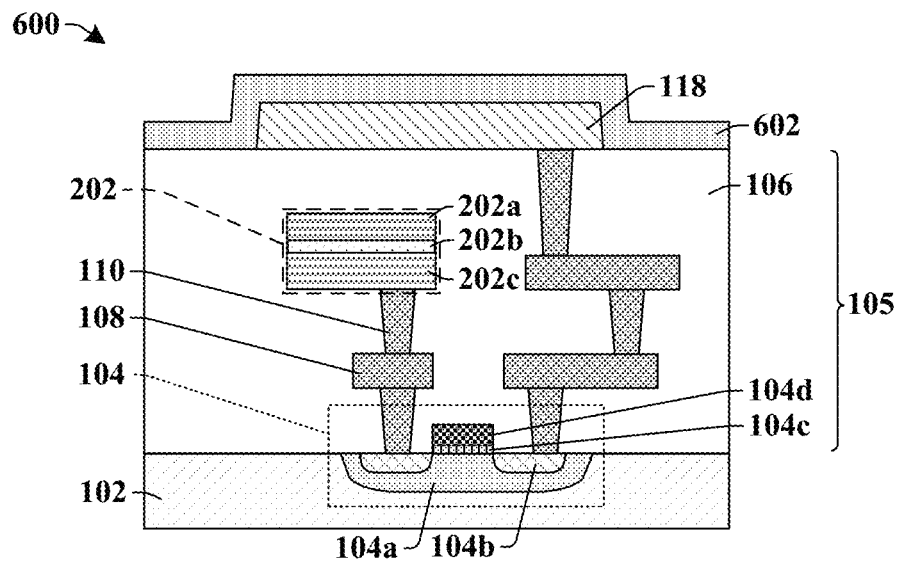

As shown in cross-sectional view 600 of FIG. 6, a passivation material 602 is formed over the bond pad 118 and over the interconnect dielectric structure 106. In some embodiments, the passivation material 602 is formed by way of a deposition process (e.g., PVD, CVD, PE-CVD, ALD, etc.). The passivation material 602 may comprise, in some embodiments, silicon nitride, silicon oxynitride, silicon carbide, an oxide (e.g., silicon dioxide, hafnium dioxide, etc.) or some other dielectric material. In some embodiments, the passivation layer 602 has a thickness in a range of between approximately 2 micrometers and approximately 5 micrometers, for example.

Figure 7:
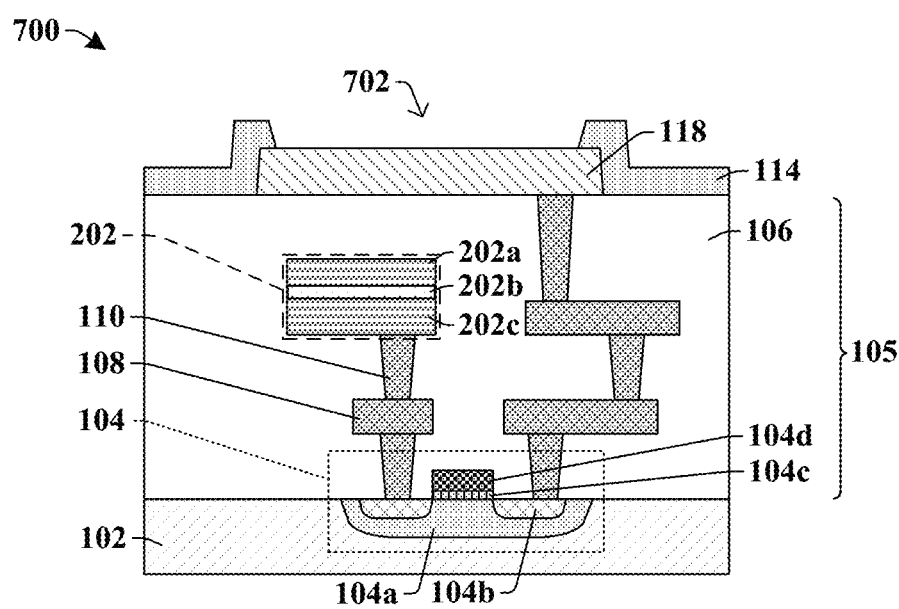

As shown in cross-sectional view 700 of FIG. 7, a second opening 702 is formed in the passivation material (602 of FIG. 6) thereby forming a passivation layer 114 comprising the second opening 702 to expose the bond pad 118. In some embodiments, the second opening 702 in the passivation layer 114 is formed by selectively removing portions of the passivation layer 114 that directly overlie the bond pad 118. For example, in some embodiments, a masking structure is formed over the passivation material (602 of FIG. 6), wherein the masking structure comprises an opening that directly overlies the bond pad 118. The masking structure and corresponding opening may be formed by way of a patterning process (e.g., photolithography/etching). In some embodiments, a removal process (e.g., wet etching, dry etching) is then performed to remove portions of the passivation material (602 of FIG. 6) according to the opening in the masking structure to form the passivation layer 114 comprising the second opening 702. The masking structure may then be removed by, for example, wet etching.

Figure 8:
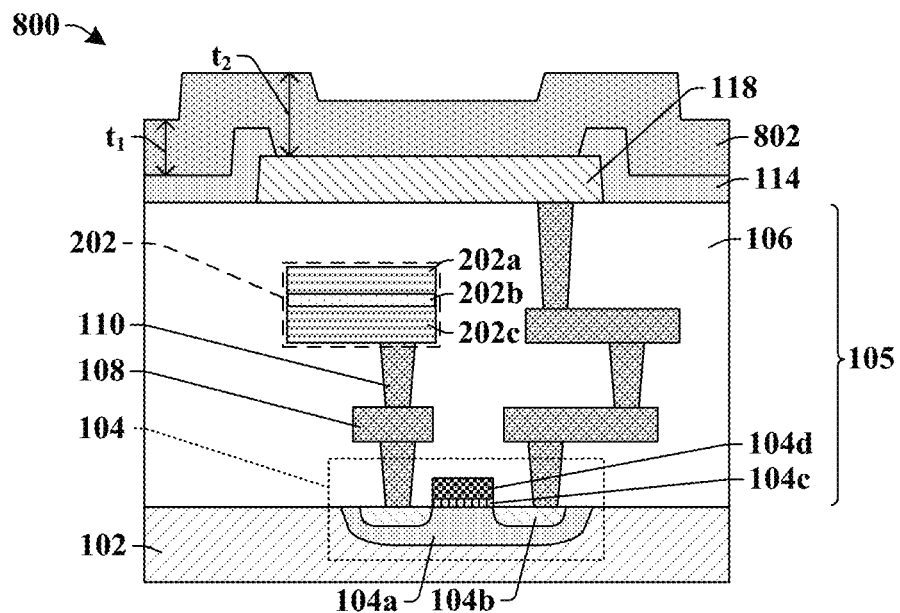

As shown in cross-sectional view 800 of FIG. 8, a polymeric material 802 is formed over the bond pad 118 and the passivation layer 114. In some embodiments, the polymeric material 802 is formed by way of a spin-coating process, whereas in other embodiments, the polymeric material 802 is formed by way of other deposition processes (e.g., PVD, CVD, PE-CVD, ALD, etc.). The polymeric material 802 is a photoresist material, and thus, can be removed by photolithography processes. The polymeric material 802 is or comprises, in some embodiments, a polymer. In some embodiments, the polymeric material 802 comprises carbon, oxygen, and a halogen. The halogen may be, for example, fluorine or chlorine. In the steps associated with the cross-sectional view 800 of FIG. 8, the polymeric material 802 is deposited but not cured. Further, in some embodiments, the polymeric material 802 has a first thickness $t_1$ in a range of between approximately 3 micrometers and approximately 10 micrometers. The first thickness $t_1$ may be a minimum thickness of the polymeric material 802 that is measured from a top surface of the polymeric material 802 to a top surface of the passivation layer 114, in some embodiments. In some embodiments, the polymeric material 802 may have a second thickness $t_2$ that is a maximum thickness. In some embodiments, the second thickness $t_2$ is in a range of between approximately 3 micrometers and approximately 15 micrometers.

Figure 9:
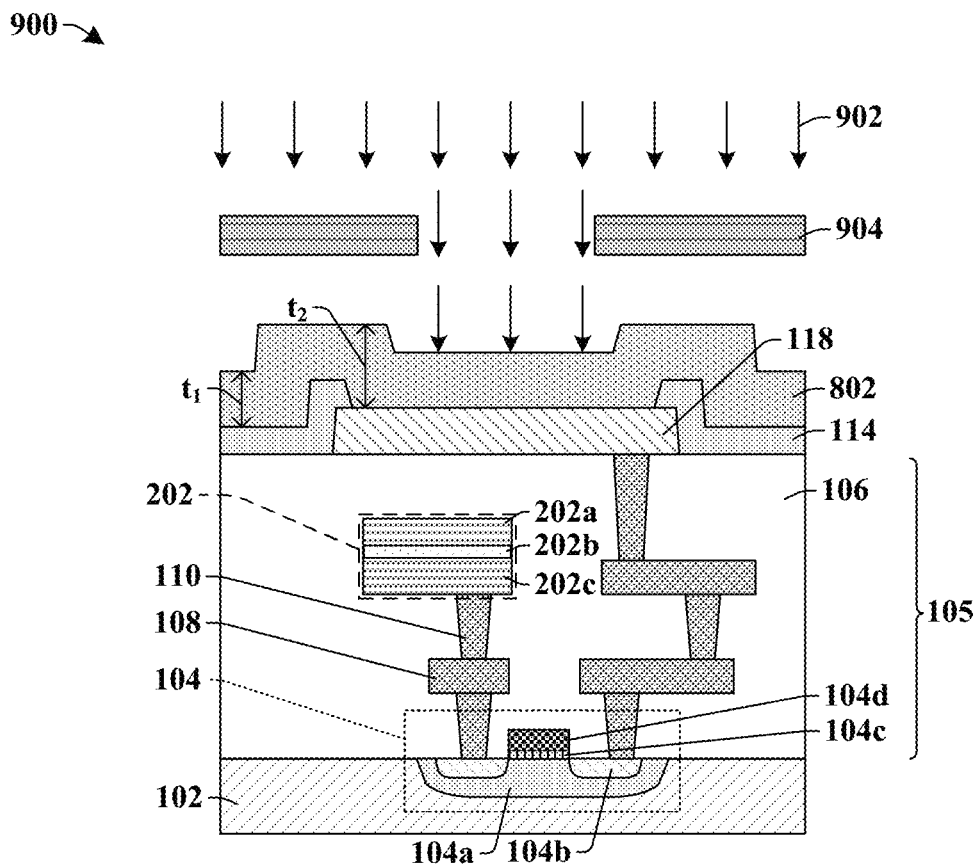

As shown in cross-sectional view 900 of FIG. 9, in some embodiments, a photolithography exposure process is performed to expose a portion of the polymeric material 802 to light 902 (e.g., ultraviolet (UV) light). In some embodiments, a photomask 904 is used to focus the light 902 to a portion of the polymeric material 802 to the light while protecting other portions of the polymeric material 802 from exposure to the light 902. In the cross-sectional view 900 of FIG. 9, the light 902 is directed to a portion of the polymeric material 802 that directly overlies the bond pad 118. In some embodiments, upon exposure to the light 902, the structure of the polymeric material 802 may change to become more soluble than portions of the polymeric material 802 that were not exposed to the light 902. In such embodiments, the polymeric material 802 may be insoluble, and the light 902 causes portions of the polymeric material 802 to be soluble. In other embodiments (not shown), the polymeric material 802 may already be soluble, and the light 902 causes portions of the polymeric material to be insoluble. In such other embodiments, a different photomask would be used than the photomask 904 in FIG. 9.

Figure 10:
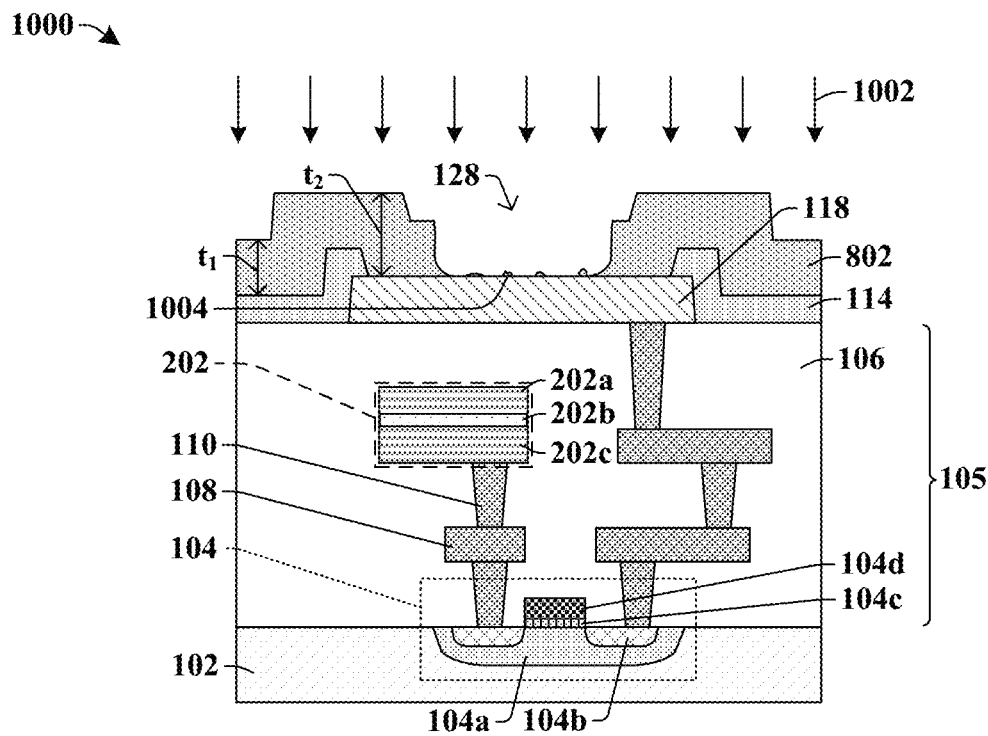

As shown in cross-sectional view 1000 of FIG. 10, in some embodiments, a photolithography development process 1002 is performed to remove portions of the polymeric material 802 that are soluble from the photolithography exposure process. In some embodiments, the photolithography development process 1002 comprises a chemical developer or wet etchant. The photolithography development process 1002 forms a first opening 128 in the polymeric material 802. In such embodiments, the first opening 128 directly overlies and exposes the bond pad 118. In some embodiments after the photolithography development process 1002, residue 1004 may remain on the bond pad 118. In some embodiments, the residue 1004 may comprise, for example, aluminum, oxygen, copper, carbon, a halogen, or a combination thereof.

Figure 11:
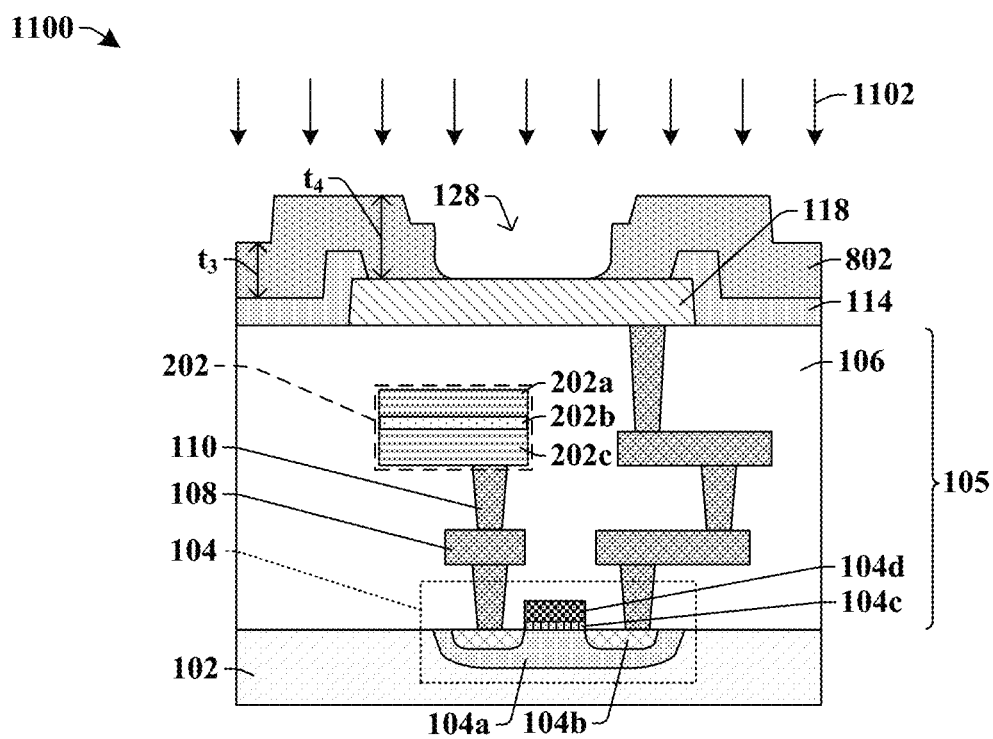

As shown in cross-sectional view 1100 of FIG. 11, an ashing process 1102 is performed to clean the bond pad 118 arranged under the first opening 128. Thus, in some embodiments, the ashing process 1102 may remove the residue (1004 of FIG. 10) from the bond pad 118. In some embodiments, the ashing process 1102 comprises a plasma gas. For example, in some embodiments, the ashing process 1102 comprises a mixture of oxygen and nitrogen gases. In some embodiments, the ashing process 1102 removes the polymeric material 802 at an etch rate in a range of between approximately 0.1 micrometers per second and approximately 0.5 micrometers per second. In some embodiments, because the polymeric material 802 is not cured, the etch rate of the ashing process 1102 is higher than if the polymeric material 802 were cured. In some embodiments, to remove the residue (1004 of FIG. 10), the ashing process 1102 is conducted for a time period in a range of between approximately 5 seconds and approximately 10 seconds.

Further, in some embodiments, the polymeric material 802 is uncovered and thus, exposed to the ashing process 1102. In such embodiments, after the ashing process 1102, the polymeric material 802 may be thinner than before the ashing process 1102. For example, before the ashing process 1102, the polymeric material 802 has a first thickness ($t_1$ of FIG. 10) in a range of between approximately 3 micrometers and approximately 10 micrometers and a second thickness ($t_2$ of FIG. 10) in a range of between approximately 3 micrometers and approximately 15 micrometers. In some embodiments, the ashing process 1102 reduces the first and second thickness ($t_1$, $t_2$ of FIG. 10) by a value in a range of between approximately 0.5 micrometers and approximately 1 micrometer. Thus, after the ashing process 1102, in some embodiments, the polymeric material 802 has a third thickness $t_3$ in a range of between approximately 2 micrometers and approximately 9.5 micrometers and a fourth thickness $t_4$ in a range of between approximately 2 micrometers and approximately 14.5 micrometers.

Figure 12:
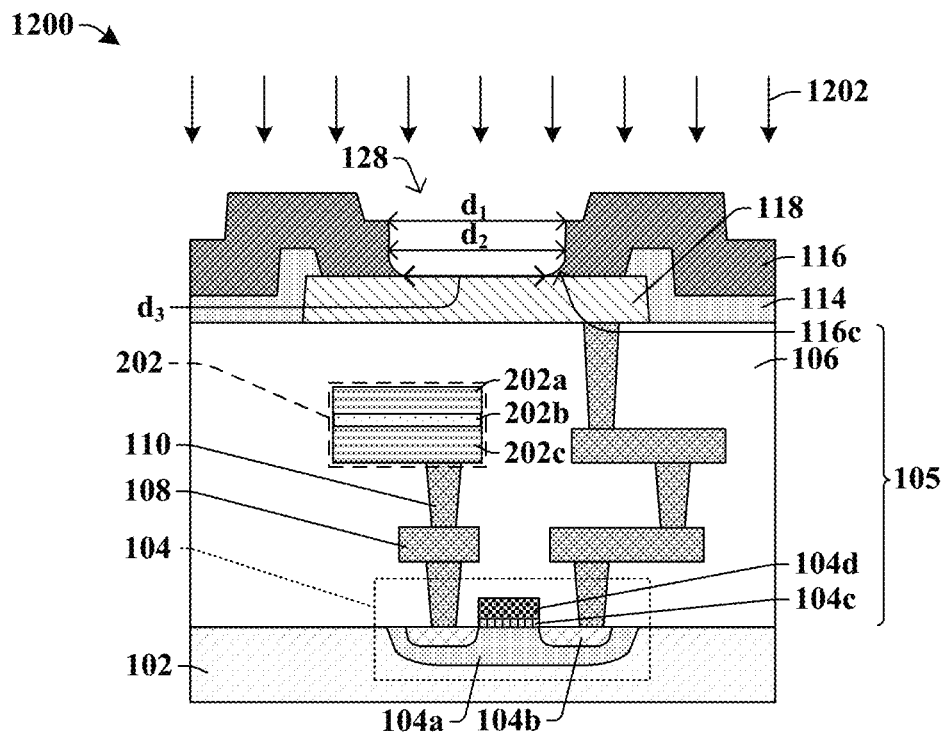

As shown in cross-sectional view 1200 of FIG. 12, in some embodiments, a curing process 1202 may be performed to cure the polymeric material (802 of FIG. 11) thereby forming a polymeric protection layer 116 over the bond pad 118 and the passivation layer 114. In some embodiments, the curing process 1202 is conducted in a furnace. In some embodiments, the furnace is heated to a temperature that is less than or equal to 300 degrees Celsius to cure the polymeric material (802 of FIG. 11). For example, in some embodiments, the furnace may be heated to a temperature in a range of between approximately 275 degrees Celsius and approximately 285 degrees Celsius to cure the polymeric material (802 of FIG. 11). The lower the temperature for curing, the less likely the semiconductor device 104, memory device 202, and/or other features arranged over the substrate 102 are at risk of thermal degradation.

In some embodiments, after the curing process 1202, the first opening 128 in the polymeric protection layer 116 has a first width equal to a first distance $d_1$. The first distance $d_1$ of the first opening 128 may be a maximum width of the first opening 128 and measured at a first location between inner sidewalls of the polymeric protection layer 116. In some embodiments, the first distance $d_1$ may be in a range of between, for example, approximately 10 micrometers and approximately 40 micrometers. Further, in some embodiments, the first opening 128 in the polymeric protection layer 116 has a second width equal to a second distance $d_2$. The second distance $d_2$ of the first opening 128 may be measured at a second location between inner sidewalls of the polymeric protection layer 116, wherein the second location is below the first location. In some embodiments, the second distance $d_2$ may be in a range of between, for example, approximately 10 micrometers and approximately 40 micrometers. In some embodiments, the second distance $d_2$ is less than or equal to the first distance $d_1$. Further, a bottom surface of the first opening 128 may be defined by a top surface of the bond pad 118 that is exposed and directly underlies the first opening 128. In such embodiments, the bottom surface of the first opening 128 may have a third width equal to a third distance $d_3$. The third distance $d_3$ of the first opening 128 may be measured at a third location between inner sidewalls of the polymeric protection layer 116, wherein the third location is below the first and second locations. The third distance $d_3$ of the first opening 128 may be a minimum width of the first opening 128. In some embodiments, the third distance $d_3$ may be in a range of between, for example, approximately 8 micrometers and approximately 40 micrometers. Thus, in some embodiments, the third distance $d_3$ is less than the first distance $d_1$ and the second distance $d_2$. Further, in some embodiments, the first distance $d_1$ may be as low as 10 micrometers while the first thickness ($t_1$ of FIG. 10) is as high as 10 micrometers because the polymeric protection layer 116 comprises a halogen, in some embodiments, for example, a ratio of the first thickness ($t_1$ of FIG. 10) to the first distance $d_1$ is greater than about 0.5. It will be appreciated that in other embodiments, the ratio of the first thickness ($t_1$ of FIG. 10) to the first distance $d_1$ could be less than or equal to about 0.5.

In some embodiments, the third distance $d_3$ is less than the first distance $d_1$ because an inner corner region 116c of the polymeric protection layer 116 are substantially rounded. In some embodiments, the difference between the third distance $d_3$ and the first distance $d_1$ is in a range of between approximately 1 micrometer and 5 micrometers.

The curing process 1202 is performed after the ashing process (1102 of FIG. 11). During the ashing process (1102 of FIG. 11), in some embodiments, halogens are released/de-bonded from the polymer structure of the polymeric material (802 of FIG. 11) such that "loose" halogen ions may be present on the bond pad 118 and/or the polymeric material (802 of FIG. 11). The halogen ions may react with various etching and/or cleaning solutions used in future steps of processing. Thus, the curing process 1202 is performed after the ashing process (1102 of FIG. 11) to re-bond the "loose" halogen ions to the polymer structure. In some embodiments, after the ashing process (1102 of FIG. 11) and before the curing process 1202, the bond pad 118 comprises a first concentration of halogen ions. After the curing process 1202, the bond pad 118 comprises a second concentration of halogen ions that is less than the first concentration of halogen ions. In some embodiments, a ratio of the second concentration to the first concentration is about equal to 50 percent, for example. In other embodiments, the curing process 1202 may reduce the concentration of halogen ions by more than 50 percent. In some embodiments, the second concentration of halogen ions on the bond pad 118 may be equal to less than 0.9 parts per million. For example, in some embodiments, the second concentration of halogen ions on the bond pad 118 may be equal to about 0.8 parts per million. In some embodiments, the first and second concentrations of halogen ions may be measured by, for example, auger electron microscopy. It will be appreciated that other analysis techniques may be conducted to measure the first and second concentration of halogen ions on the bond pad 118 are within the scope of the disclosure.

Figure 13:
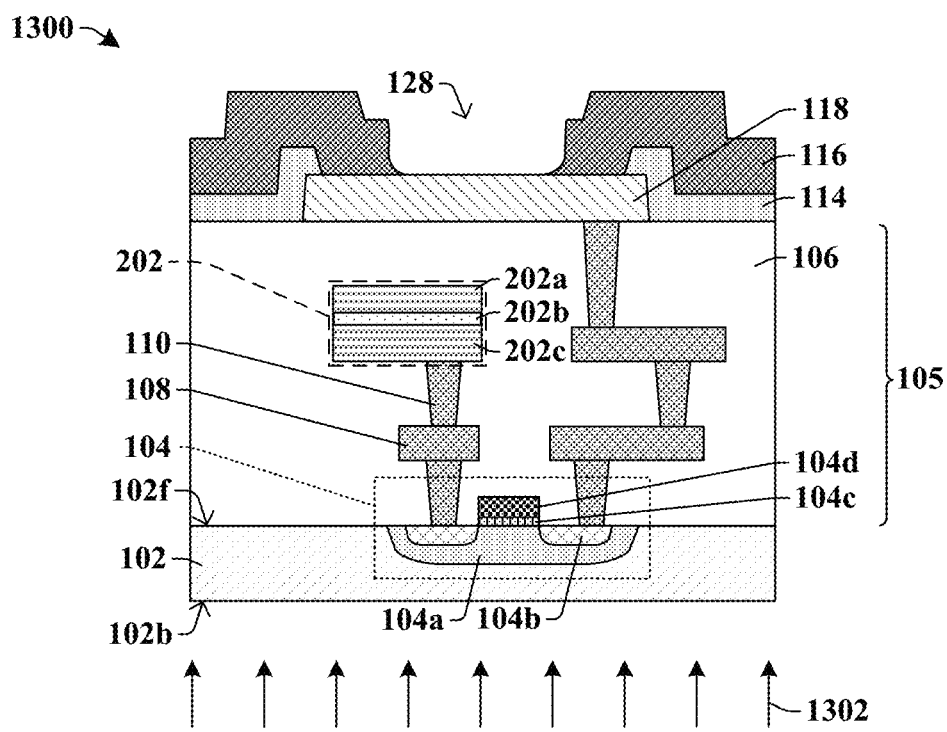

As shown in cross-sectional view 1300 of FIG. 13, in some embodiments, a scrub process 1302 is performed to clean a backside 102b of the substrate 102. In some embodiments, the scrub process 1302 comprises a water based solution that is directed towards the backside 102b of the substrate 102. The backside 102b of the substrate 102 is opposite to a frontside 102f of the substrate 102, wherein the interconnect structure 105 is arranged on the frontside 102f of the substrate 102. During the scrub process 1302, the integrated chip is in an environment with a high concentration of water vapor. The scrub process 1302 is performed after the ashing process (1102 of FIG. 11), and the curing process (1202 of FIG. 12) is performed between the ashing process (1102 of FIG. 11) and the ashing process (1102 of FIG. 11). Thus, reaction of "loose" halogen ions with water vapor from the scrub process 1202 that would form an acid is mitigated, thereby mitigating corrosion to the bond pad 118 by such acid.

Figure 14A:
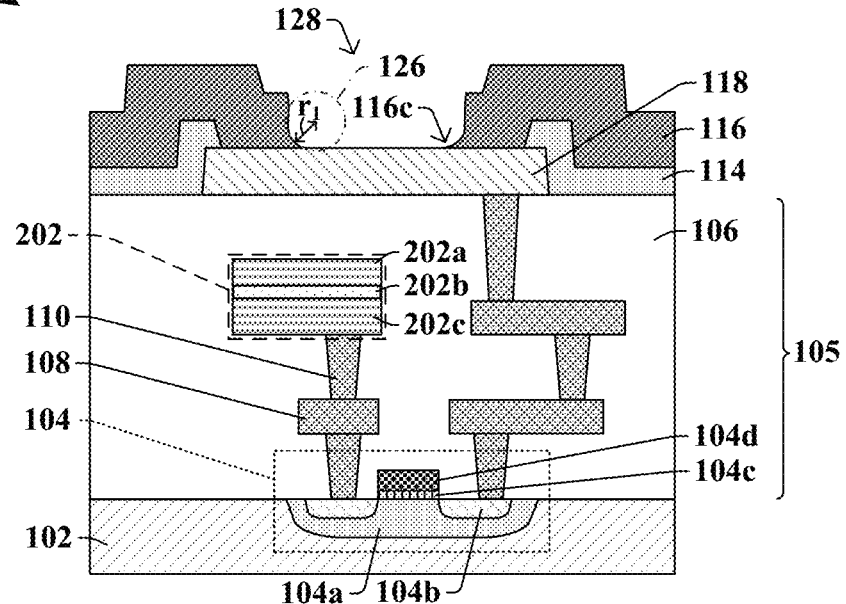

As shown in cross-sectional view 1400A of FIG. 14A, after the scrub process 1302, the polymeric protection layer 116 may have an inner corner region 116c that is substantially rounded. Further, in some embodiments, the inner corner region 116c, has a radius of curvature $r_1$ that is less than or equal to approximately 5 micrometers. In some embodiments, the radius of curvature $r_1$ may be measured by drawing a circle 126 that has a perimeter that substantially overlaps with the curvature of the inner corner region 116c. The radius of the circle 126 is equal to radius of curvature $r_1$. In some embodiments, the inner corner region 116c of the polymeric protection layer 116 defines lower corners of the first opening 128 of the polymeric protection layer 116.

Figure 14B:
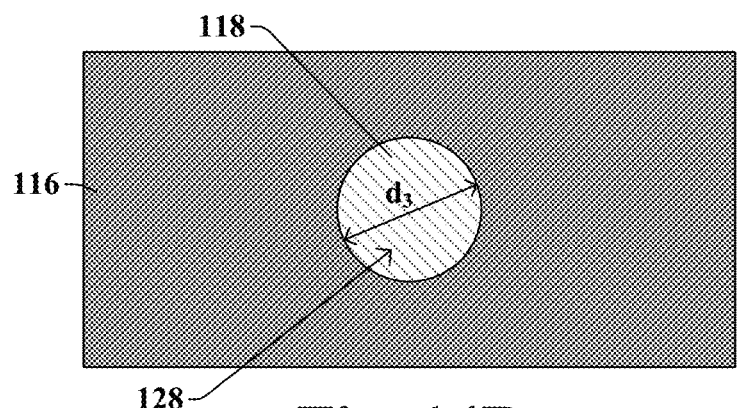

FIG. 14B illustrates top-view 1400B of some embodiments of the first opening 128 in the polymeric protection layer 116. In some embodiments, from the top-view 1400B perspective, the first opening 128 in the polymeric protection layer 116 has a substantially circular shape. The diameter of the circular shape of the first opening 128 in top-view 1400B may be equal to the third distance $d_3$, in some embodiments. In such embodiments, the third distance $d_3$ may be in a range of between, for example, approximately 8 micrometers and approximately 40 micrometers. In other embodiments, the first opening 128 may have a substantially oval-like, square-like, rectangle-like, or some other polygon-like shape from the top-view 1400B.

Figure 15:
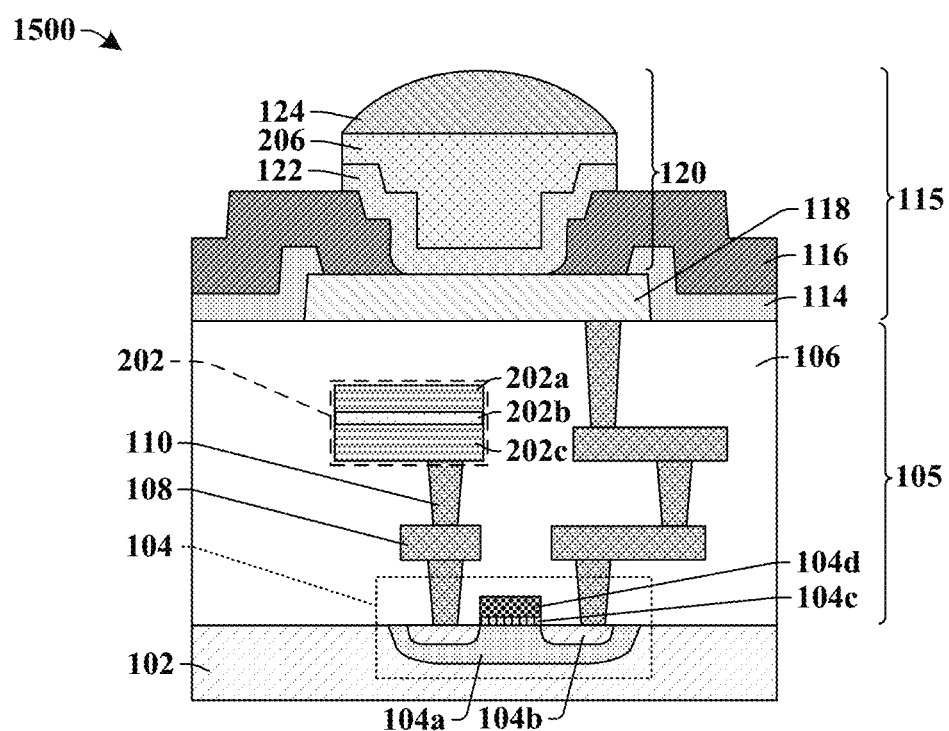

As illustrated in cross-sectional view 1500 of FIG. 15, in some embodiments, a bonding structure 120 may be formed over the polymeric protection layer 116 and extending through the first opening (128 of FIG. 14A) of the polymeric protection layer 116 to directly contact the bond pad 118. In such embodiments, the bonding structure 120 and the polymeric protection layer 116 may make up a package structure 115 of the integrated chip. In some embodiments, the bonding structure 120 comprises an under bump metallization (UBM) layer 122 that directly contacts the polymeric protection layer 116 and the bond pad 118. In some embodiments, the bonding structure 120 further comprises a conductive core structure 206 arranged over the UBM layer 122, and a conductive bump 124 arranged over the conductive core structure 206. In such embodiments, the UBM layer 122 comprises copper, aluminum, or a combination thereof, for example. Further, the conductive core structure 206 may comprise, for example, copper, aluminum, tungsten, or some other conductive metal, in some embodiments. In some embodiments, the conductive bump 124 comprises a solder material such as, for example, tin, silver, copper, bismuth, nickel, lead, or a combination thereof.

In some embodiments, the bonding structure 120 may be formed through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching). For example, in some embodiments, a masking structure may be formed over the polymeric protection layer 116 that comprises an opening directly overlying and exposing the first opening (128 of FIG. 14A). Then, the UBM layer 122, the conductive core structure 206, and/or the conductive bump 124 may be formed in the opening of the masking structure by a plating process. Then, the masking structure and excess materials of the bonding structure 120 arranged over the masking structure may be removed by a removal process (e.g., wet etching, dry etching), thereby forming the bonding structure 120.

Because of the thermal and mechanical properties of the polymeric protection layer 116, the polymeric protection layer 116 protects underlying features from thermal and mechanical stresses during formation of the bonding structure 120. Further, the polymeric protection layer 116 may protect underlying features from mechanical and thermal stress through external bonding processes such as using the conductive bump 124 to couple the integrated chip in FIG. 15 to some external device such as, for example, to another integrated chip in flip-chip bonding. Further, because the polymeric protection layer 116 was cured after the ashing process (1102 of FIG. 11), but before the scrub process (1302 of FIG. 13), corrosion to the bond pad 118 is reduced and reliability and life-time of the integrated chip is increased.

Figure 16:
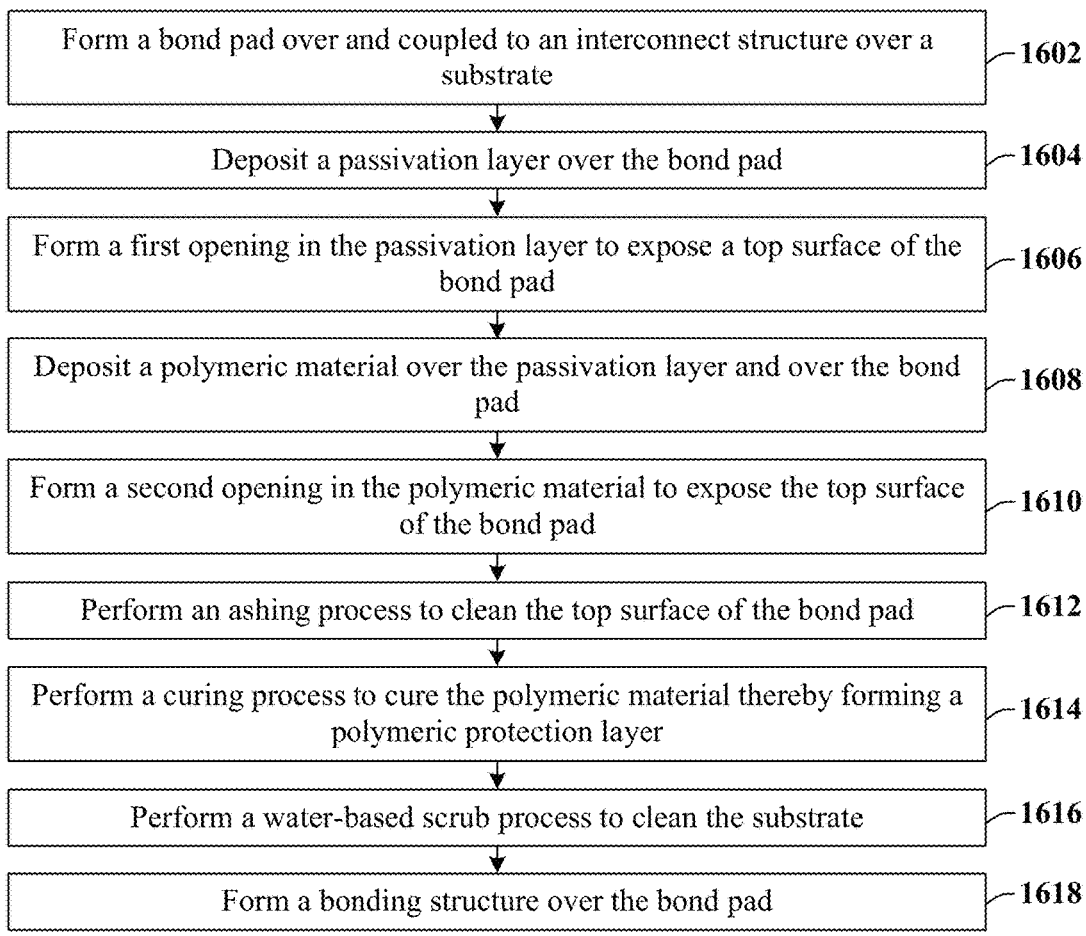
FIG. 16 illustrates a flow diagram of some embodiments of a method corresponding to FIGS. 3-15.

FIG. 16 illustrates a flow diagram of some embodiments of a method 1600 corresponding to FIGS. 3-15.

While method 1600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1602, a bond pad is formed over and coupled to an interconnect structure over a substrate. FIG. 5 illustrates a cross-sectional view 500 of some embodiments corresponding to act 1602.

At act 1604, a passivation layer is deposited over the bond pad. FIG. 6 illustrates a cross-sectional view 600 of some embodiments corresponding to act 1604.

At act 1606, a first opening is formed in the passivation layer to expose a top surface of the bond pad. FIG. 7 illustrates a cross-sectional view 700 of some embodiments corresponding to act 1606.

At act 1608, a polymeric material is deposited over the passivation layer and over the bond pad. FIG. 8 illustrates a cross-sectional view 800 of some embodiments corresponding to act 1608.

At act 1610, a second opening is formed in the polymeric material to expose the top surface of the bond pad. FIGS. 9 and 10 illustrate cross-sectional views 900 and 1000 of some embodiments corresponding to act 1610.

At act 1612, an ashing process is performed to clean the top surface of the bond pad. FIG. 11 illustrates a cross-sectional view 1100 of some embodiments corresponding to act 1612.

At act 1614, a curing process is performed to cure the polymeric material thereby forming a polymeric protection layer. FIG. 12 illustrates a cross-sectional view 1200 of some embodiments corresponding to act 1614.

At act 1616, a water-based scrub process is performed to clean the substrate. FIG. 13 illustrates a cross-sectional view 1300 of some embodiments corresponding to act 1616.

At act 1618, a bonding structure is formed over the bond pad. FIG. 15 illustrates a cross-sectional view 1500 of some embodiments corresponding to act 1618.

Therefore, the present disclosure relates to a polymeric protection layer comprising a halogen arranged over a bond pad, and a method of forming the polymeric protection layer to mitigate corrosion to the bond pad.

Accordingly, in some embodiments, the present disclosure relates to a method comprising: forming an interconnect structure over a substrate; forming a bond pad coupled to the interconnect structure; depositing a polymeric material over the bond pad; performing a patterning process to remove a portion of the polymeric material to form an opening in the polymeric material, wherein the opening directly overlies and exposes the bond pad; performing a first cleaning process; curing the polymeric material to form a polymeric protection layer; and performing a second cleaning process.

In other embodiments, the present disclosure relates to a method comprising: depositing a polymeric material over a bond pad; performing a photolithography and etching process to remove a portion of the polymeric material that directly overlies the bond pad to form an opening in the polymeric material; performing a first cleaning process comprising plasma gas to clean the bond pad; curing the polymeric material after performing the first cleaning process to form a polymeric protection layer from the polymeric material; and performing a second cleaning process comprising a liquid solution to clean the bond pad and the polymeric protection layer, wherein the second cleaning process is performed after the curing of the polymeric material.

In yet other embodiments, the present disclosure relates to an integrated chip comprising: an interconnect structure arranged over a substrate, wherein the interconnect structure comprises wires and vias embedded in an interconnect dielectric structure; a bond pad arranged over the interconnect structure; a passivation structure arranged over the bond pad, wherein the passivation structure comprises a first opening arranged directly over the bond pad; and a polymeric protection layer arranged over the passivation structure and the bond pad, wherein the polymeric protection layer comprises a second opening arranged directly over the bond pad, wherein the second opening is smaller than the first opening, and wherein the polymeric protection layer comprises a halogen.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming an interconnect structure over a substrate;
forming a bond pad coupled to the interconnect structure;
depositing a polymeric material over the bond pad;
performing a patterning process to remove a portion of the polymeric material to form an opening in the polymeric material, wherein the opening directly overlies and exposes the bond pad;
performing a first cleaning process;
curing the polymeric material to form a polymeric protection layer; and
performing a second cleaning process.

2. The method of claim 1, wherein the first cleaning process is or comprises an ashing process.

3. The method of claim 2, wherein the ashing process comprises nitrogen and oxygen gas.

4. The method of claim 1, wherein the second cleaning process comprises a water-based solution scrub process.

5. The method of claim 1, further comprising:
forming an under-bump metallization layer over the bond pad and the polymeric protection layer, wherein the under-bump metallization layer directly contacts the bond pad; and
forming a conductive bump over the under-bump metallization layer.

6. The method of claim 1, wherein the polymeric material comprises a halogen.

7. The method of claim 1, wherein the patterning process comprises:
selectively exposing the polymeric material to a UV light source; and
removing portions of the polymeric material that were exposed to the UV light source through etching.

8. The method of claim 1, wherein the curing of the polymeric material is performed after the first cleaning process and before the second cleaning process.

9. A method comprising:
depositing a polymeric material over a bond pad;
performing a photolithography and etching process to remove a portion of the polymeric material that directly overlies the bond pad to form an opening in the polymeric material;
performing a first cleaning process comprising plasma gas to clean the bond pad;
curing the polymeric material after performing the first cleaning process to form a polymeric protection layer from the polymeric material; and
performing a second cleaning process comprising a liquid solution to clean the bond pad and the polymeric protection layer, wherein the second cleaning process is performed after the curing of the polymeric material.

10. The method of claim 9, wherein the plasma gas comprises nitrogen and oxygen.

11. The method of claim 9, wherein the deposition of the polymeric material comprises a spin-coating process.

12. The method of claim 9, wherein the curing of the polymeric material comprises:
heating the polymeric material in a furnace to a temperature that is between about 50 degrees Celsius and about 300 degrees Celsius.

13. The method of claim 9, wherein the first cleaning process removes the polymeric material at a rate of at least about 0.2 micrometers per second.

14. An integrated chip comprising:
an interconnect structure arranged over a substrate, wherein the interconnect structure comprises wires and vias embedded in an interconnect dielectric structure;
a bond pad arranged over the interconnect structure;
a passivation structure arranged over the bond pad, wherein the passivation structure comprises a first opening arranged directly over the bond pad; and
a polymeric protection layer arranged over the passivation structure and the bond pad, wherein the polymeric protection layer comprises a second opening arranged directly over the bond pad, wherein the second opening is smaller than the first opening, wherein the polymeric protection layer comprises a halogen, and wherein the polymeric protection layer further comprises:
a bottommost surface directly contacting the bond pad; and
an inner sidewall coupled to the bottommost surface by an inner corner region that is rounded,
wherein the inner corner region is concave up with respect to a set of axes comprising a first axis and a second axis, wherein the first axis is perpendicular to the second axis, and wherein the second axis is normal to a top surface of the bond pad.

15. The integrated chip of claim 14, wherein the inner corner region has a radius of curvature that is at most 5 micrometers.

16. The integrated chip of claim 14, further comprising:
an under-bump metallization layer arranged over the polymeric protection layer, wherein the under-bump metallization layer extends through the first and second openings and directly contacts the bond pad.

17. The integrated chip of claim 16, wherein the under-bump metallization layer has a bottommost corner that directly contacts the polymeric protection layer, wherein the bottommost corner is curved, and wherein the bottommost corner is concave up with respect to the set of axes comprising the first axis and the second axis.

18. The integrated chip of claim 17, wherein the bottommost corner has a radius of curvature that is at most 5 micrometers.

19. The integrated chip of claim 14, wherein the second opening has a maximum width, wherein the polymeric protection layer has a first thickness that is a minimum thickness of the polymeric protection layer measured between a top surface of the polymeric protection layer to a top surface of the passivation structure, and wherein a ratio of the first thickness to the maximum width is greater than 0.5.

20. The integrated chip of claim 14, wherein the passivation structure comprises a first layer arranged over a second layer, and wherein the first opening extends completely through the first layer and the second layer.

\* \* \* \* \*